(12) United States Patent
Mori

(10) Patent No.: US 10,629,618 B2
(45) Date of Patent: Apr. 21, 2020

(54) SEMICONDUCTOR DEVICE, OPERATION METHOD OF SEMICONDUCTOR DEVICE, AND MANUFACTURING METHOD OF SEMICONDUCTOR DEVICE

(71) Applicant: SONY SEMICONDUCTOR SOLUTIONS CORPORATION, Kanagawa (JP)

(72) Inventor: Shigetaka Mori, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/325,887

(22) PCT Filed: Sep. 8, 2017

(86) PCT No.: PCT/JP2017/032391
§ 371 (c)(1),
(2) Date: Feb. 15, 2019

(87) PCT Pub. No.: WO2018/056068
PCT Pub. Date: Mar. 29, 2018

(65) Prior Publication Data
US 2019/0214408 A1 Jul. 11, 2019

(30) Foreign Application Priority Data

Sep. 21, 2016 (JP) .................. 2016-184219

(51) Int. Cl.
*H01L 27/118* (2006.01)
*H01L 29/423* (2006.01)
(Continued)

(52) U.S. Cl.
CPC ........ *H01L 27/11807* (2013.01); *G01R 31/26* (2013.01); *G01R 31/28* (2013.01);
(Continued)

(58) Field of Classification Search
CPC .................................. H01L 27/11807
See application file for complete search history.

(56) References Cited

U.S. PATENT DOCUMENTS 7,069,525 B2 * 6/2006 Bhushan ................. H01L 22/20
257/E21.525
8,204,704 B2 * 6/2012 Leroux .................... H01L 22/34
257/48
(Continued)

FOREIGN PATENT DOCUMENTS

| JP | 07-58602 A | 3/1995 |
| JP | 07-058602 A | 3/1995 |

(Continued)

OTHER PUBLICATIONS

Tsuji, et al., "Effective Channel Length Estimation Using Charge-Based Capacitance Measurement", 2013 IEEE International Conf. Microelectronic Test Structures, ICMTS 2013, pp. 59-63.
(Continued)

*Primary Examiner* — Eugene Lee
(74) *Attorney, Agent, or Firm* — Chip Law Group

(57) ABSTRACT

The present disclosure relates to a semiconductor device, an operation method of a semiconductor device, and a manufacturing method of a semiconductor device which are capable of minimizing influence of a gate length variation on a circuit characteristic and increasing a good product ratio (yield) in a product sorting test. A ring oscillator configured such that the plurality of inverters is connected in a ring-like form, and gate capacitors of the transistors are connected to respective output terminals of the plurality of inverters as a load capacitor outputs an oscillating signal, the ring oscillator is configured with a plurality of transistors having the same gate length, and at least two or more ring oscillators including a plurality of transistors having different gate lengths are configured. At the time of product test, the gate
(Continued)

length is calculated on the basis of frequencies of oscillating signals of a plurality of ring oscillators, and a back bias is applied in accordance with a correction value corresponding to the calculated gate length, and an operation is performed. The present disclosure can be applied to semiconductor devices.

12 Claims, 16 Drawing Sheets

(51) Int. Cl.
  *G01R 31/28* (2006.01)
  *H01L 29/78* (2006.01)
  *H01L 21/66* (2006.01)
  *G01R 31/26* (2020.01)
  *H01L 27/092* (2006.01)

(52) U.S. Cl.
  CPC ........ *H01L 22/34* (2013.01); *H01L 29/42376* (2013.01); *H01L 29/78* (2013.01); *H01L 27/092* (2013.01); *H01L 2027/11827* (2013.01); *H01L 2027/11866* (2013.01)

(56) References Cited

U.S. PATENT DOCUMENTS

| | | | |
|---|---|---|---|
| 2003/0230733 | A1 | 12/2003 | Tanaka |
| 2006/0291110 | A1* | 12/2006 | Kanno ................. G11C 11/419 361/18 |
| 2011/0090015 | A1* | 4/2011 | Sumita ................ H03K 3/0315 331/56 |
| 2011/0169580 | A1* | 7/2011 | Dodrill ................. H03B 29/00 331/56 |
| 2016/0028406 | A1* | 1/2016 | Kobayashi ........... H03K 3/0315 331/57 |
| 2016/0329882 | A1* | 11/2016 | Liu ....................... H03K 3/0315 |
| 2017/0069659 | A1* | 3/2017 | Kawasumi ........ H01L 27/11582 |
| 2017/0264272 | A1* | 9/2017 | Hatanaka ............. H03K 3/0315 |

FOREIGN PATENT DOCUMENTS

| | | |
|---|---|---|
| JP | 07-202131 A | 8/1995 |
| JP | 10-242806 A | 9/1998 |
| JP | 11-008282 A | 1/1999 |
| JP | 11-8282 A | 1/1999 |
| JP | 11-041076 A | 2/1999 |
| JP | 11-41076 A | 2/1999 |
| JP | 2004-020325 A | 1/2004 |
| JP | 2004-20325 A | 1/2004 |
| JP | 2008-298621 A | 12/2008 |
| JP | 2010-010515 A | 1/2010 |
| JP | 2013-077672 A | 4/2013 |
| JP | 2016-092076 A | 5/2016 |

OTHER PUBLICATIONS

Gattiker, et al., "Data Analysis Techniques for CMOS Technology Characterization and Product Impact Assessment", 2006 IEEE, pp. 1-10.

International Search Report and Written Opinion of PCT Application No. PCT/JP2017/032391, dated Oct. 31, 2017, 9 pages of ISRWO.

Gattiker, et al., "Data Analysis Techniques for CMOS Technology Characterization and Product Impact Assessment", 2006 IEEE, 10 pages.

Tsuji, et al., "Effective Channel Length Estimation Using Charge-Based Capacitance Measurement", 2013 IEEE Int. Conf. Microelectronic Test Structures, 59-63 pages.

\* cited by examiner

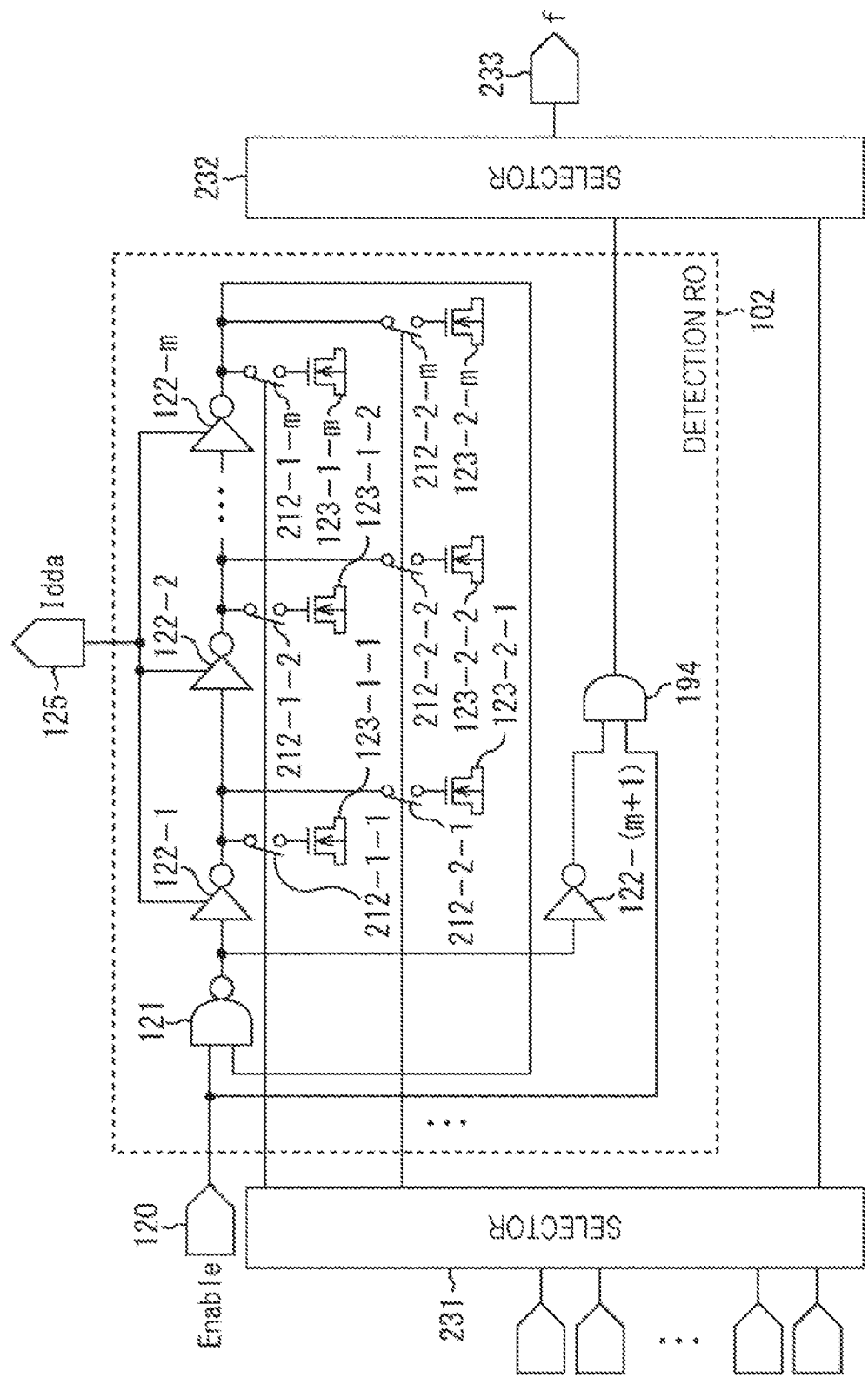

SEMICONDUCTOR DEVICE, OPERATION METHOD OF SEMICONDUCTOR DEVICE, AND MANUFACTURING METHOD OF SEMICONDUCTOR DEVICE

CROSS REFERENCE TO RELATED APPLICATIONS

This application is a U.S. National Phase of International Patent Application No. PCT/JP2017/032391 filed on Sep. 8, 2017, which claims priority benefit of Japanese Patent Application No. JP 2016-184219 filed in the Japan Patent Office on Sep. 21, 2016. Each of the above-referenced applications is hereby incorporated herein by reference in its entirety.

TECHNICAL FIELD

The present disclosure relates to a semiconductor device, an operation method of a semiconductor device, and a manufacturing method of a semiconductor device, and more particularly, to a semiconductor device, an operation method of a semiconductor device, and a manufacturing method of a semiconductor device which are capable of minimizing influence of a gate length variation on a circuit characteristic and increasing a good product ratio (yield) in a product sorting test.

BACKGROUND ART

In recent years, it has become difficult to secure an operation margin of a circuit characteristic due to an increase in a variation in a semiconductor device characteristic, particularly, a field effect transistor characteristic (hereinafter a "transistor variation") associated with miniaturization.

If an assumed circuit operation margin is unable to be secured due to a transistor variation, a yield degradation occurs, thus, there are cases in which a circuit area is increased to be larger than assumed if a circuit is designed to secure an operation margin so that a yield degradation does not occur.

Therefore, there is a demand for a countermeasure of specifying a cause of a transistor variation, taking a processing countermeasure to suppress a variation, and introducing a circuit robust to the transistor variation.

There are various factors as the cause of the transistor variation, but particularly, influence of variations in a gate length and an effective gate length caused by patterning exceeding a wavelength limit of lithography is large, and thus it is necessary to quantitatively detect the gate length variation for the countermeasure.

In other words, if it is possible to quantitatively detect the gate length variation accurately, a countermeasure of optimizing a processing process such as lithography, a gate process, and a thermal process that cause the gate length variation and managing a mass-production process so that the variation is minimized or making influence of the variation uniform is possible.

For the mass production management of the gate length, a technique of picking some wafers after the gate lithography or the gate process, measuring gate length dimensions of several to several tens of spots in a wafer surface, and performing management so that the variation falls within a preset specification is common.

However, if it is desired to perform length measurement in all wafers or in various spots, it takes time, and at this stage, it is unable to specify whether or not the gate length variation affects an electrical characteristic variation of a transistor.

In this regard, a technique of placing a test device that extracts a gate length electrically in a scribe, performing a test process of measuring a gate length electrically after performing a processing process, and performing management so that the variation falls within a preset specification range has been proposed (see Non-Patent Document 1).

In this case, one test device is arranged in one shot which is commonly an exposure unit of lithography, and although it is measured in the test devices of all shots, there is a detection limit to covering a variation within a wafer surface.

As a countermeasure against the technique disclosed in Non-Patent Document 1, a technique of placing a test device in a chip rather than a scribe is considered.

However, in a case in which the test device is arranged in the chip, a dedicated measurement pad for monitoring an electric current of the test device is additionally necessary, and in a case in which it is desired to perform measurement using a logic tester, a memory tester, or the like, it is difficult to secure sufficient measurement accuracy, and it takes time to measure.

In this regard, a method of arranging a monitor circuit using a ring oscillator (RO) as a test device to be installed in a chip has been proposed (see Non-Patent Document 2).

Since the ring oscillator is capable of performing digital output, an output pad can be shared with other monitor circuits by switching a test mode through a test control circuit, and it can be configured without adding a pad.

Further, it is also possible to place the monitor circuit in an arbitrary region in the chip, and compatibility with a chip design is high.

Further, it is easy to measure the digital output of the ring oscillator in the logic tester or the like, a measurement time is also shorter than that in the current measurement, and it is possible to monitor the ring oscillator at the same time as a chip sorting test, and thus detection sensitivity for the variation within a wafer surface is high.

In the technique disclosed in Non-Patent Document 2, a frequency variation of the ring oscillator when a configuration of the ring oscillator is changed to an inverter, a NAND, a NOR, or the like or a fan-out is changed is investigated.

CITATION LIST

Non-Patent Document

Non-Patent Document 1: Tsuji and K. Terada, "Effective Channel Length Estimation Using Charge-Based Capacitance Measurement," IEEE International Conference on Microelectronic Test Structures (ICMTS), pp. 59-63, 2013.

Non-Patent Document 2: Anne Gattiker, Manjul Bhushan and Mark B. Ketchen, "Data Analysis Techniques for CMOS Technology Characterization and Product Impact Assessment," IEEE International Test Conference, pp. 1-10, 2006.

SUMMARY OF THE INVENTION

Problems to be Solved by the Invention

However, even though the configuration of the ring oscillator is changed to an inverter, a NAND, a NOR, or the like or the fan-out is changed, various variation factors and the gate length variation are unable to be distinguished, and thus the gate length is unable to be directly extracted.

The present disclosure has made in light of the foregoing, and it is desirable to minimize, particularly, the influence of the gate length variation on the circuit characteristic and increasing the good product ratio (yield) of the product.

A semiconductor device according to an aspect of the present disclosure is a semiconductor device, including: a plurality of transistors; a plurality of inverters; a ring oscillator configured such that the plurality of inverters is connected in a ring-like form, and gate capacitors of the transistors are connected to respective output terminals of the plurality of inverters as a load capacitor; and a terminal that outputs an oscillating signal of the ring oscillator, in which the ring oscillator is configured with a plurality of transistors having the same gate length, and at least two or more ring oscillators including a plurality of transistors having different gate lengths are configured.

The at least two or more ring oscillators are configured such that gate capacitors of the transistors of the same gate length are connected to the respective output terminals of the plurality of the inverters as the load capacitor.

Solutions to Problems

A selector that selects the least two or more ring oscillators may be further included.

In the at least two or more ring oscillators, gate capacitors of the transistors having at least two or more types of different gate lengths may be connected to the respective output terminals of the plurality of the inverters in parallel as the load capacitor, a plurality of switches that connects the inverters and the gate capacitors in series and performs on/off switching may be installed, and switching to at least two or more ring oscillators is performed by performing the on/off switching of the switch to which the gate capacitors of the same type of gate lengths may be connected.

A selector that selects the switch to which the gate capacitors of the same type of gate lengths are connected among the plurality of switches may be further included.

A terminal for measuring an operating current of the ring oscillator may be further included.

The semiconductor device may be connected with a calculating unit that calculates a gate length on the basis of a frequency of the oscillating signal.

The calculating unit may compare the calculated gate length with a design value, and outputs a correction value on the basis of a comparison result, and a back bias control unit that applies a back bias for correcting an operation of the transistor on the basis of the correction value output from the calculating unit may be further included.

An operation method of a semiconductor device according to an aspect of the present disclosure is an operation method of a semiconductor device including: a plurality of transistors; a plurality of inverters; a ring oscillator configured such that the plurality of inverters is connected in a ring-like form, and gate capacitors of the transistors are connected to respective output terminals of the plurality of inverters as a load capacitor; and a terminal that outputs an oscillating signal of the ring oscillator, in which the ring oscillator is configured with a plurality of transistors having the same gate length, and at least two or more ring oscillators including a plurality of transistors having different gate lengths are configured, the operation method including: outputting, by the ring oscillator, an oscillating signal from the terminal.

A manufacturing method of a semiconductor device according to an aspect of the present disclosure is a manufacturing method of a semiconductor device including: a plurality of transistors; a plurality of inverters; a ring oscillator configured such that the plurality of inverters is connected in a ring-like form, and gate capacitors of the transistors are connected to respective output terminals of the plurality of inverters as a load capacitor; and a terminal that outputs an oscillating signal of the ring oscillator, in which the ring oscillator is configured with a plurality of transistors having the same gate length, and at least two or more ring oscillators including a plurality of transistors having different gate lengths are configured, the manufacturing method including: forming a plurality of transistors and the plurality of inverters in a first process; and forming wiring connecting the plurality of transistors with the plurality of inverters in a second process.

In the second process, the wiring connecting the gate capacitors of the transistors of the same gate length with the respective output terminals of the plurality of inverters as the load capacitor may be formed.

In the first process, a plurality of switches that connects each of the inverters and each of the gate capacitors in series and performs on/off switching may be further formed, and in the second process, the wiring connecting the gate capacitors of the transistors of at least two or more types of different gate lengths with the respective output terminals of the plurality of inverters in parallel as the load capacitor may be formed.

In one aspect of the present disclosure, a semiconductor device includes a plurality of transistors, a plurality of inverters, a ring oscillator configured such that the plurality of inverters is connected in a ring-like form, and gate capacitors of the transistors are connected to respective output terminals of the plurality of inverters as a load capacitor, and a terminal that outputs an oscillating signal of the ring oscillator, the ring oscillator is configured with a plurality of transistors having the same gate length, and at least two or more ring oscillators including a plurality of transistors having different gate lengths are configured.

Effects of the Invention

According to one aspect of the present disclosure, it is possible to minimize the influence of the gate length variation on the circuit characteristic and increasing the good product ratio (yield) of the product.

BRIEF DESCRIPTION OF DRAWINGS

FIG. 16 is a diagram for describing a third modified example of a detection RO.

MODE FOR CARRYING OUT THE INVENTION

Figure 1:
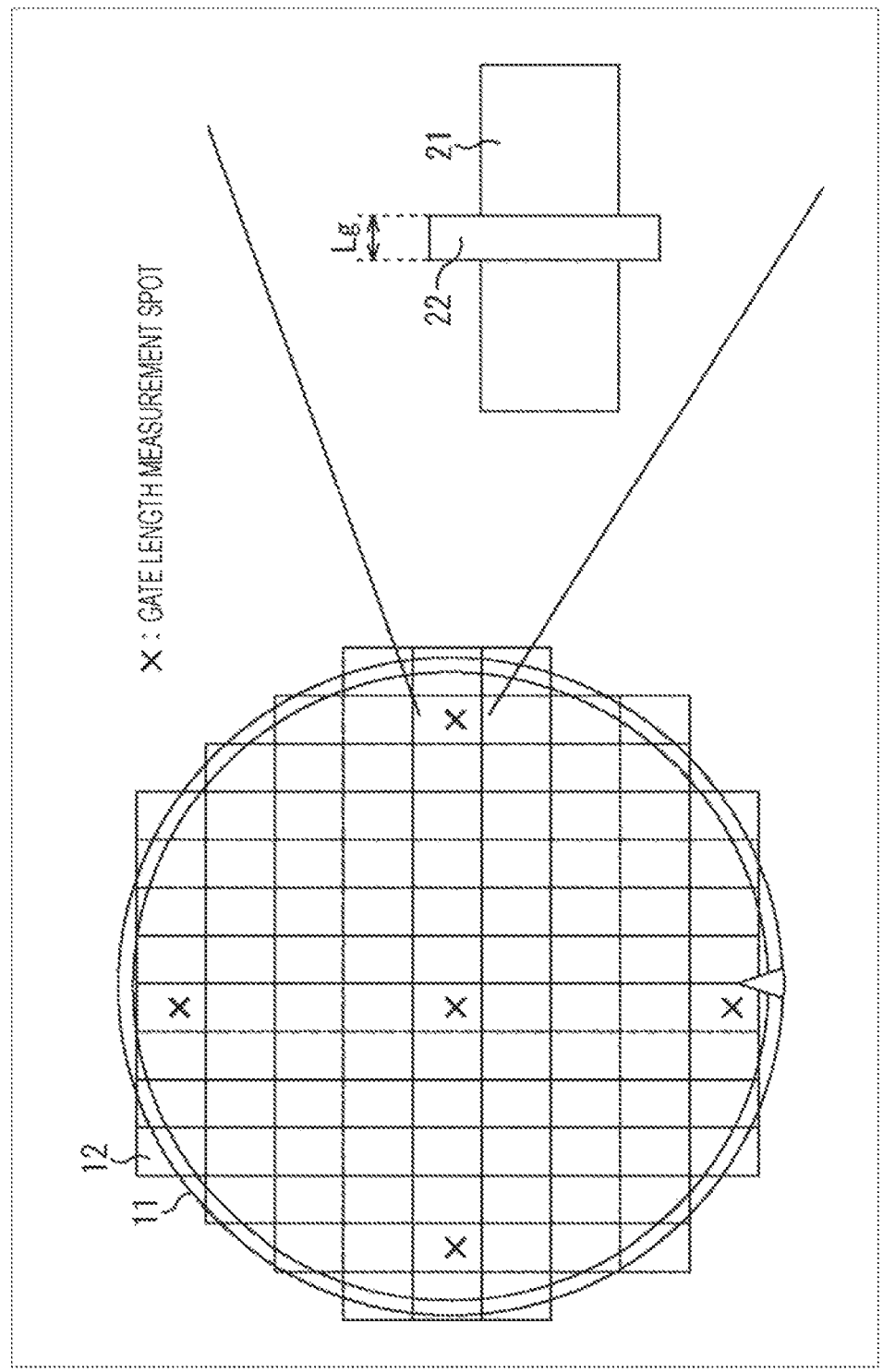
FIG. 1 is a diagram for describing a product test of a semiconductor device according to a related art.

An exemplary embodiment of the present disclosure will be described in detail with reference to the appended drawings. Further, in this specification and the drawings, the same reference numerals are assigned to constituent elements having substantially the same functional configuration, and redundant description will be omitted.

<Example of Configuration of Semiconductor Device of Related Art>

Before describing a semiconductor device to which the present disclosure technology is applied, first, a common semiconductor device of a related art will be described.

As illustrated in FIG. 1, for gate length mass production management, a technique of picking some wafers 11 after the gate lithography or the gate process, measuring a dimension of a gate length Lg of a gate 22 of a transistor 21 including an NMISFET or a PMISFET of a region 12 in one shot which is an exposure unit of lithography of a spot indicated by a cross mark in a wafer 11 surface in FIG. 1, and managing the process so that a variation falls within a preset specification is common.

In this technique, there is an advantage in that it is easy to give feedback for the lithography and gate forming process, whereas if it is desire to measure it in all wafers or various spots in a wafer surface in order to increase variation detection sensitivity, it takes a lot of time, and a processing process time increases. In addition, at this stage, it is unable to specify whether or not the gate length variation affects an electrical characteristic variation of a transistor.

In this regard, there is a technique of placing a test device that extracts a gate length electrically in a scribe, performing a test process of measuring a gate length electrically after performing a processing process, and performing management so that the variation falls within a preset specification range as disclosed in Non-Patent Document 1.

Figure 2:
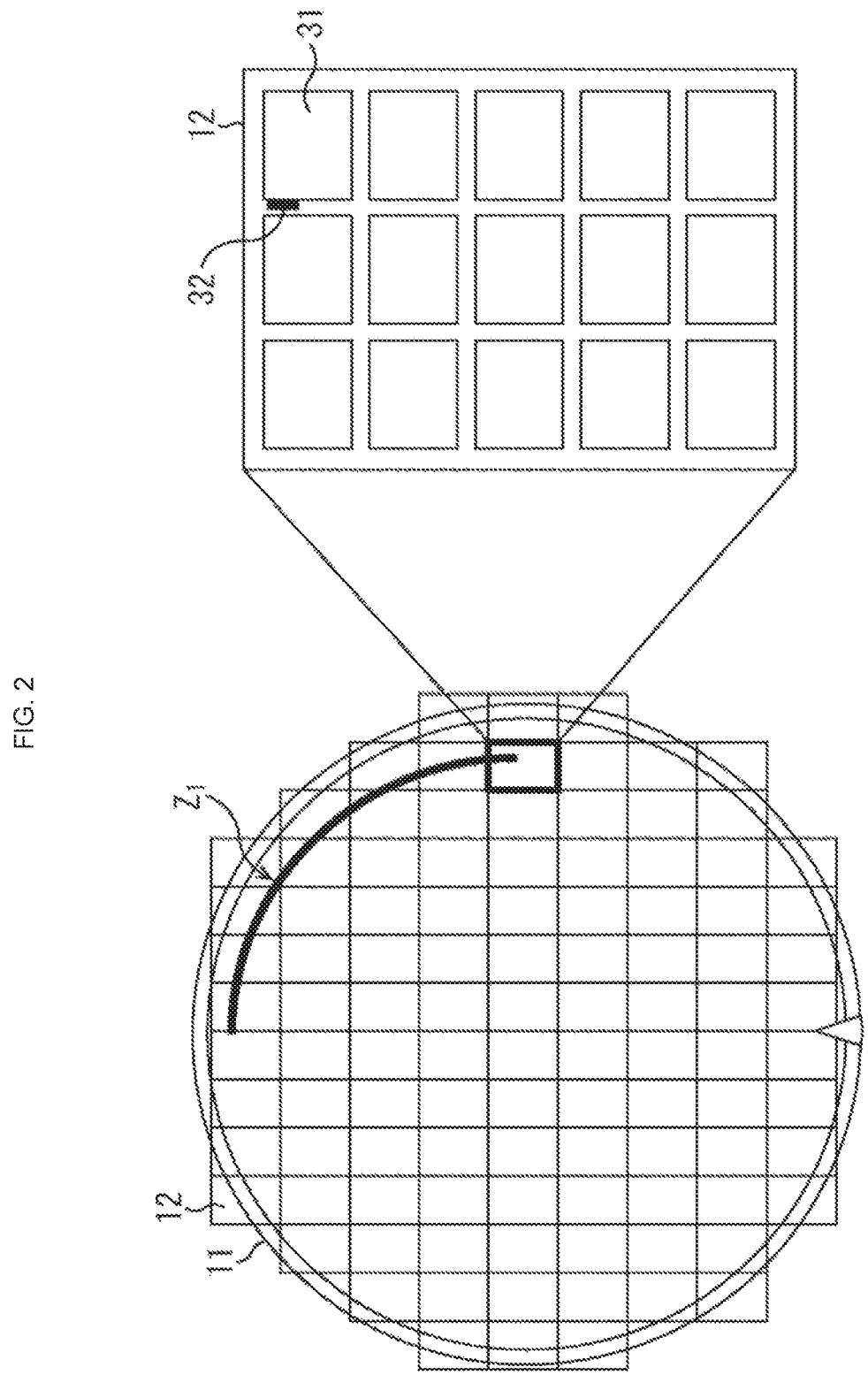
FIG. 2 is a diagram for describing a product test of a semiconductor device according to a related art.

In this case, as illustrated in a right part of FIG. 2, a test device 32 arranged in a scribe is arranged such that one test device is arranged in the region 12 of one shot which is an exposure unit of lithography, and although it is measured in the test devices of all shots, there is a detection limit to covering a variation within a wafer 11 surface.

In other words, in the example of FIG. 2, the test device 32 that measures the gate length electrically is arranged on an upper right of the region 12 corresponding to one shot. In this case, it is possible to measure it in a region Z1 on the upper right of the wafer 11 end illustrated in a left part of FIG. 2, but since the test device 32 is not arranged in the other wafer 11 ends, the gate length is unable to be measured, and the actual variation within the wafer 11 surface is unable to be detected. Further, in this technique, it is unable to be measured even in a case in which there is a gate length variation in the region 12 corresponding to one shot. Incidentally, in FIG. 2, a plurality of chips 31 (15 chips in FIG. 2) is installed in the region 12.

Figure 3:
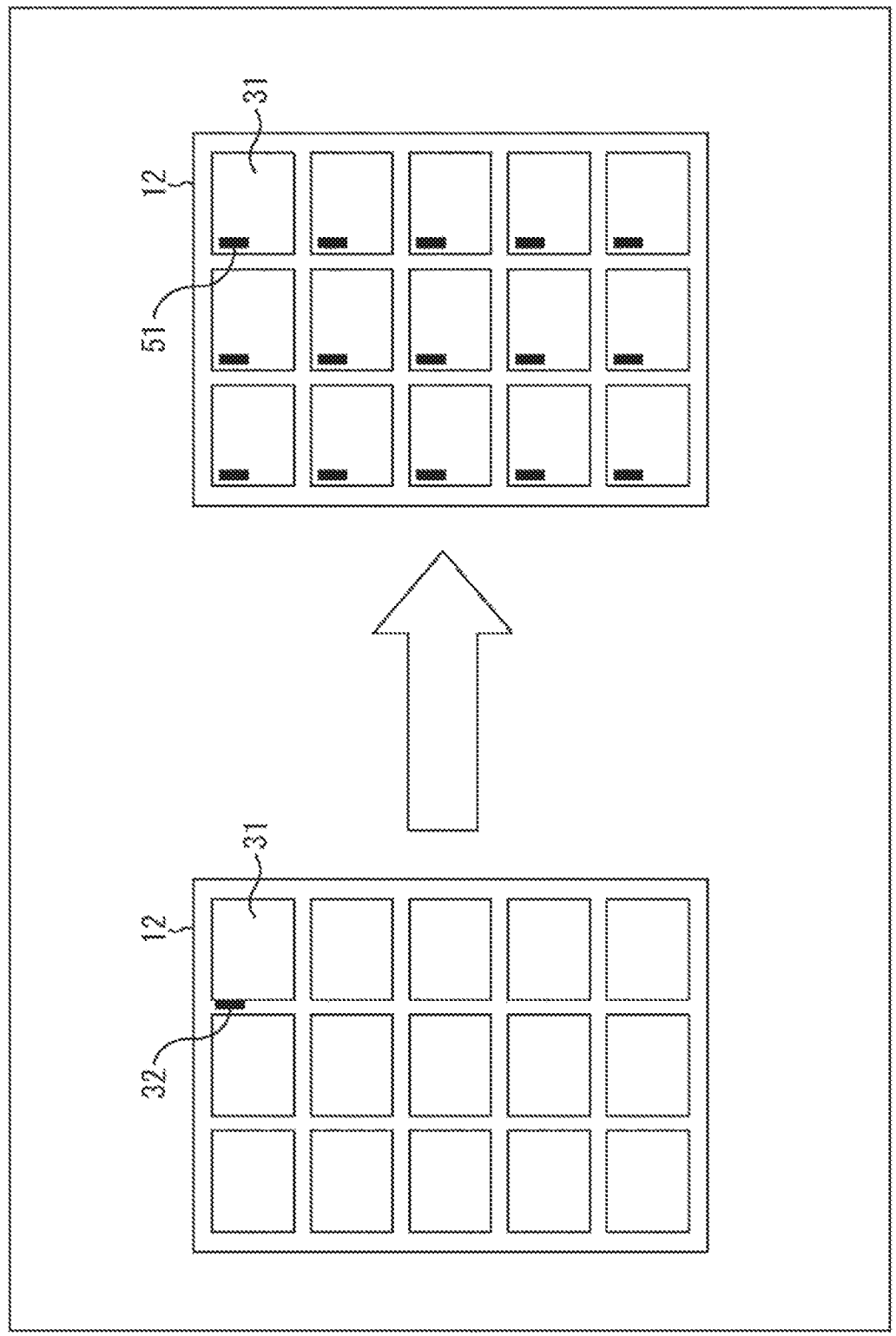
FIG. 3 is a diagram for describing a product test of a semiconductor device according to a related art.

In this regard, as a countermeasure against the technique described in Non-Patent Document 1, instead of installing the test device 32 in the scribe as illustrated in a left part of FIG. 3, a technique of arranging a test device 51 on a chip 31 as illustrated in a right part of FIG. 3 is considered. Incidentally, although the test devices 32 and 51 have the same basic functions, the test device 51 functions as the test device on the chip 31.

However, in a case in which the test device 51 is arranged on the chip 31 as illustrated in the right part of FIG. 3, a dedicated measurement pad for monitoring an electric current of the test device 51 is additionally necessary.

Further, even when the dedicated pad can be arranged, in a case in which it is desired to measure it through a logic tester, a memory tester, or the like used in a product test, it is necessary to consider current measurement accuracy and a measurement time.

In this regard, arranging a monitor circuit using a ring oscillator as the test device to be installed on the chip 31 as disclosed in Non-Patent Document 2 is considered.

Since the ring oscillator is capable of performing digital output, an output pad can be shared with other monitor circuits by switching a test mode through a test control circuit, and it can be configured without adding a pad.

Further, it is also possible to place the monitor circuit in an arbitrary region in the chip 31, and compatibility with a design of the chip 31 is high. Further, it is easy to measure the digital output of the ring oscillator in the logic tester or the like, the measurement time is also shorter than that in the current measurement, and it is possible to monitor the ring oscillator at the same time as a chip sorting test, and thus detection sensitivity for the variation within the wafer 11 surface is high.

However, even though the configuration of the ring oscillator is changed to an inverter, a NAND, a NOR, or the like or the fan-out is changed, various variation factors and the gate length variation are unable to be distinguished, and thus the gate length is unable to be directly extracted.

<Configuration Example of Semiconductor Device of the Present Disclosure>

In this regard, the semiconductor device of the present disclosure extracts a gate length Lg and an effective gate length Leff of a transistor such as an NMISFET or a PMISFET through an on-chip type monitor circuit using a ring oscillator, and corrects the gate length variation on the basis of the extracted gate length Lg and the effective gate length Leff.

More specifically, in the semiconductor device of the present disclosure, a ring oscillator in which gate capacitors of transistors such as an NMISFET or a PMISFET having at least two or more different gate lengths are arranged as a load capacitor. With this ring oscillator circuit, an oscillating frequency, an operating current, and a standby current are measured, and gate capacitance which is load capacitance is calculated.

After gate capacitance which is a load capacitance of a predetermined gate length is calculated, a gate length Lg and an effective gate length Leff can be calculated using a gate capacitance of a gate length different from the predetermined gate length. Incidentally, a method of calculating the gate capacitance, the gate length, and the effective gate length will be described later in detail.

The ring oscillator is installed on a product chip, and it is measured at the time of product test, and thus it is possible to detect the gate length variation with high degree of accuracy and improve the gate length variation detection sensitivity within a wafer 11 surface or one shot of the lithography.

Here, a configuration example of a correction system of a semiconductor device of the present disclosure will be described with reference to a block diagram of FIG. 4.

Figure 4:
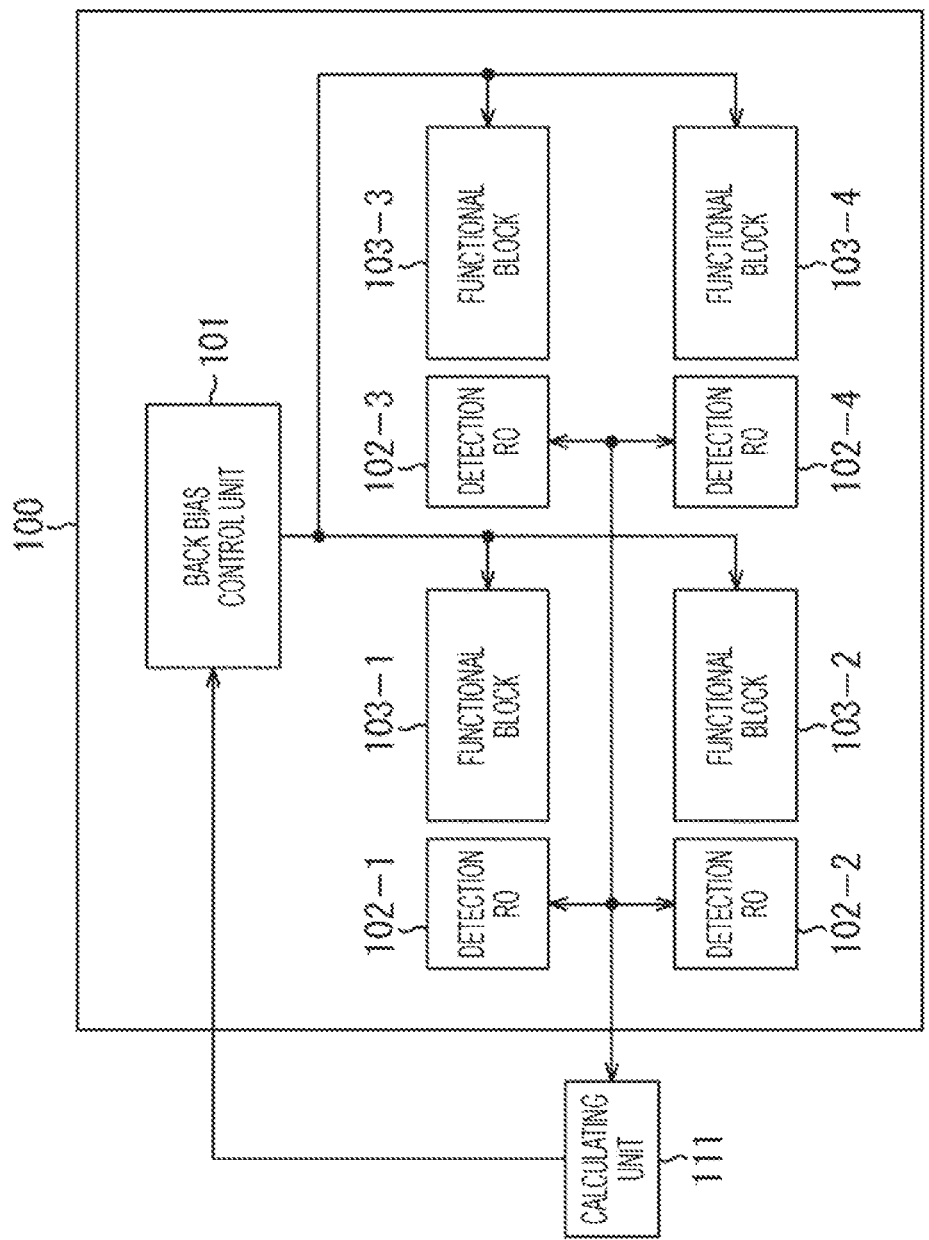
FIG. 4 is a diagram for describing a configuration example of a semiconductor device test system according to the present disclosure.

A semiconductor device testing system of FIG. 4 includes a semiconductor device 100 and a calculating unit 111. The semiconductor device 100 corresponds to the chip 31 in FIG. 3, and a plurality of semiconductor devices 100 is installed in the region 12 on the wafer 11. The calculating unit 111 is connected and used only when a product test for the semiconductor device 100 is performed. Further, the calculating unit 111 measures a gate length and an effective gate length through a product test, and causes a correction value corresponding to a measurement result to be applied when the gate length and the effective gate length do not satisfy a specification, thereby improving the yield in the product test.

The semiconductor device 100 includes a back bias control unit 101, detection ring oscillators (ROs) 102-1 to 102-4, and functional blocks 103-1 to 103-4.

The back bias control unit 101 supplies the correction value supplied from the calculating unit 111 to the functional blocks 103-1 to 103-4, and an operation of a transistor 123 (FIG. 4) including an NMISFET or a PMISFET constituting each of the detection ROs 102-1 to 102-4 is corrected by the functional blocks 103-1 to 103-4.

Incidentally, the detection ROs 102-1 to 102-4 are simply referred to as a "detection RO 102" in a case in which it is not particularly necessary to distinguish them, and the same applies to other components. Further, in FIG. 4, four detection ROs 102 are illustrated, but the number of detection ROs 102 may be any other number.

Each of the detection ROs 102-1 to 102-4 is a ring oscillator in which a gate capacitor of a transistor including an NMISFET or a PMISFET having at least two or more different gate lengths is arranged as a load capacitor.

The calculating unit 111 is connected to the semiconductor device 100 via a connection terminal (not illustrated) at the time of product test, and causes an internal detection RO 102 to be driven by the connection and measures an oscillating frequency, an operating current, and a standby current. Further, on the basis of the measured oscillating frequency, the oscillating current, and the standby current, the calculating unit 111 calculates the gate length Lg and the effective gate length Leff of the transistor including the NMISFET or the PMISFET constituting the detection RO 102, obtains the correction value on the basis of the calculated gate length Lg and the effective gate length Leff, and supplies the correction value to the semiconductor device 100. Accordingly, the back bias control unit 101 of the semiconductor device 100 supplies the correction value to the functional blocks 103-1 to 103-4 and corrects the operation of the transistor constituting each of the detection ROs 102-1 to 102-4.

Incidentally, on FIG. 4, the calculating unit 111 is installed outside the semiconductor device 100, but the calculating unit 111 may be installed in the semiconductor device 100 and operate only at the time of product test.

<Configuration Example of Detection RO>

Next, a configuration example of the detection RO 102 will be described with reference to FIG. 5.

Figure 5:
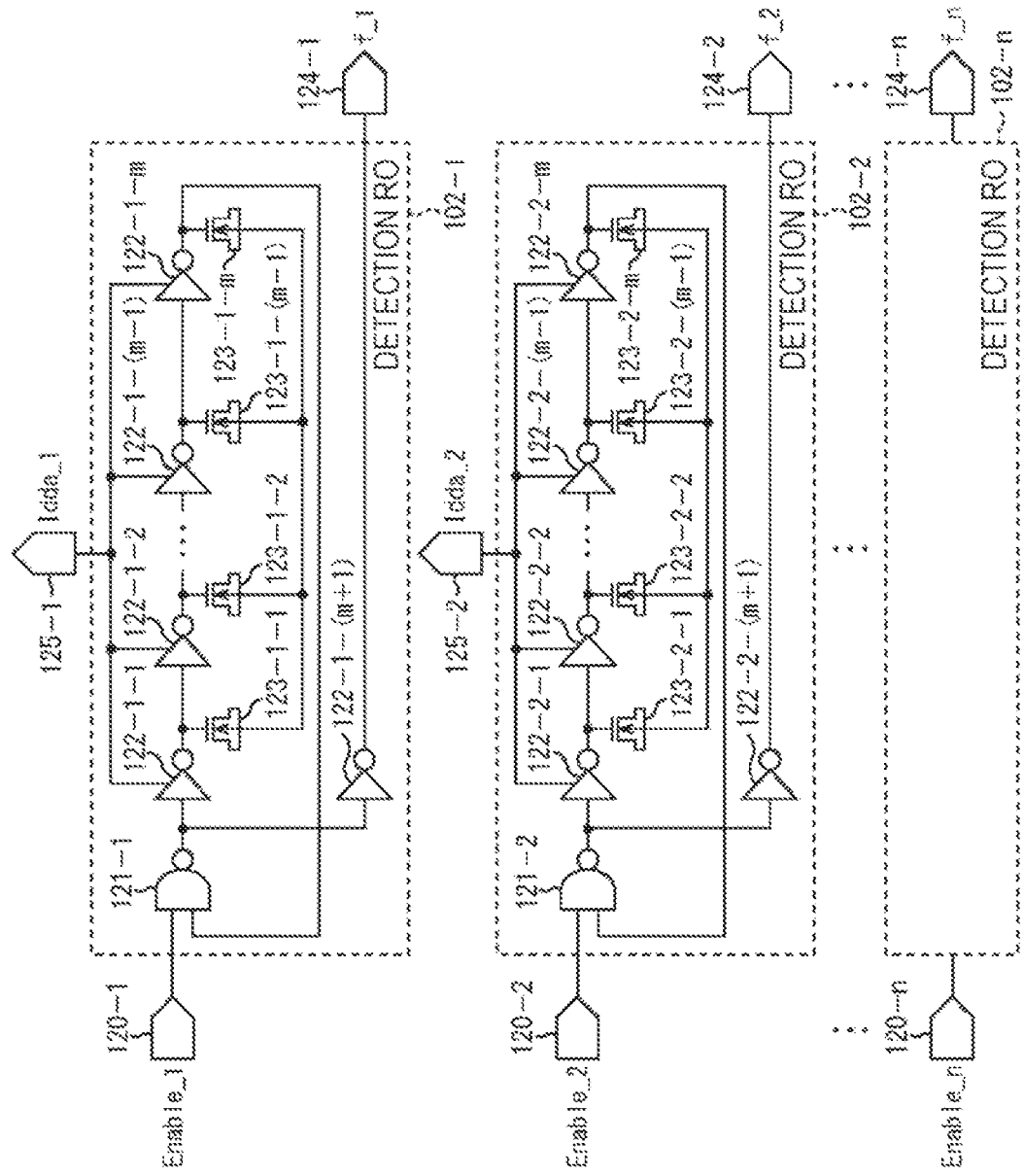
FIG. 5 is a diagram for describing a configuration example of a detection RO of FIG. 4.

A configuration example of FIG. 5 is an example including at least two or more detection ROs 102 having a gate capacitor having different gate lengths as a load capacitor, that is, an example in which n detection ROs 102-1 to 102-n are installed is illustrated in FIG. 5. Incidentally, four sets of configurations of FIG. 5 are included in the semiconductor device 100 of FIG. 4.

In the detection RO 102-1, input terminals of inverters 122-1-1 and 122-1-(m+1) are connected to an output terminal of a NAND circuit 121-1, and an input terminal of an inverter 122-1-2 and a gate of a transistor 123-1-1 of a gate length Lg1 are connected to the output terminal of the inverter 121-1-1. An input terminal of an inverter 122-1-3 and a gate of a transistor 123-1-2 of a gate length Lg1 are connected to an output terminal of the inverter 121-1-2. Inverters 122-1-3 to 122-1-m and transistors 123-1-3 to 123-1-m are connected with a similar configuration. An output terminal of an inverter 122-1-m and a gate of a transistor 123-1-m are connected to one input terminal of NAND circuit 121-1. The other input terminal of the NAND circuit 121-1 is connected to a terminal 120-1 of an enable signal Enable_1. An output terminal of the inverter 122-1-(m+1) is connected to a terminal 124-1 of an output signal f_1. Further, the inverters 122-1 to 122-1-m are connected with a terminal 125-1 for measuring an oscillating current and a standby current.

Hereinafter, in the detection ROs 102-2 to 102-n, transistors 123-2 to 123-n are configured for every gate lengths Lg2 to Lgn, respectively, and terminals 120-2 to 120-n of enable signal Enable_2 to Enable_n, terminals 124-2 to 124-n of output signals f_2 to f_n, and terminals 125-2 to 125-n are installed.

In other words, as a basic configuration, the detection RO 102 is configured such that a plurality of inverters 122 is connected in a ring-like form, and the gate of the transistor 123 having the same gate length Lg1 is connected between the inverters 122. Further, at least two detection ROs 102 having different gate lengths are formed.

Incidentally, the number of sets of inverter 122 and transistor 123 is hereinafter also referred to as a stage number, and in FIG. 5, for example, each detection RO 102 is also referred to as an m-th stage ring oscillator.

<Calculation Method of Gate Length>

Figure 6:
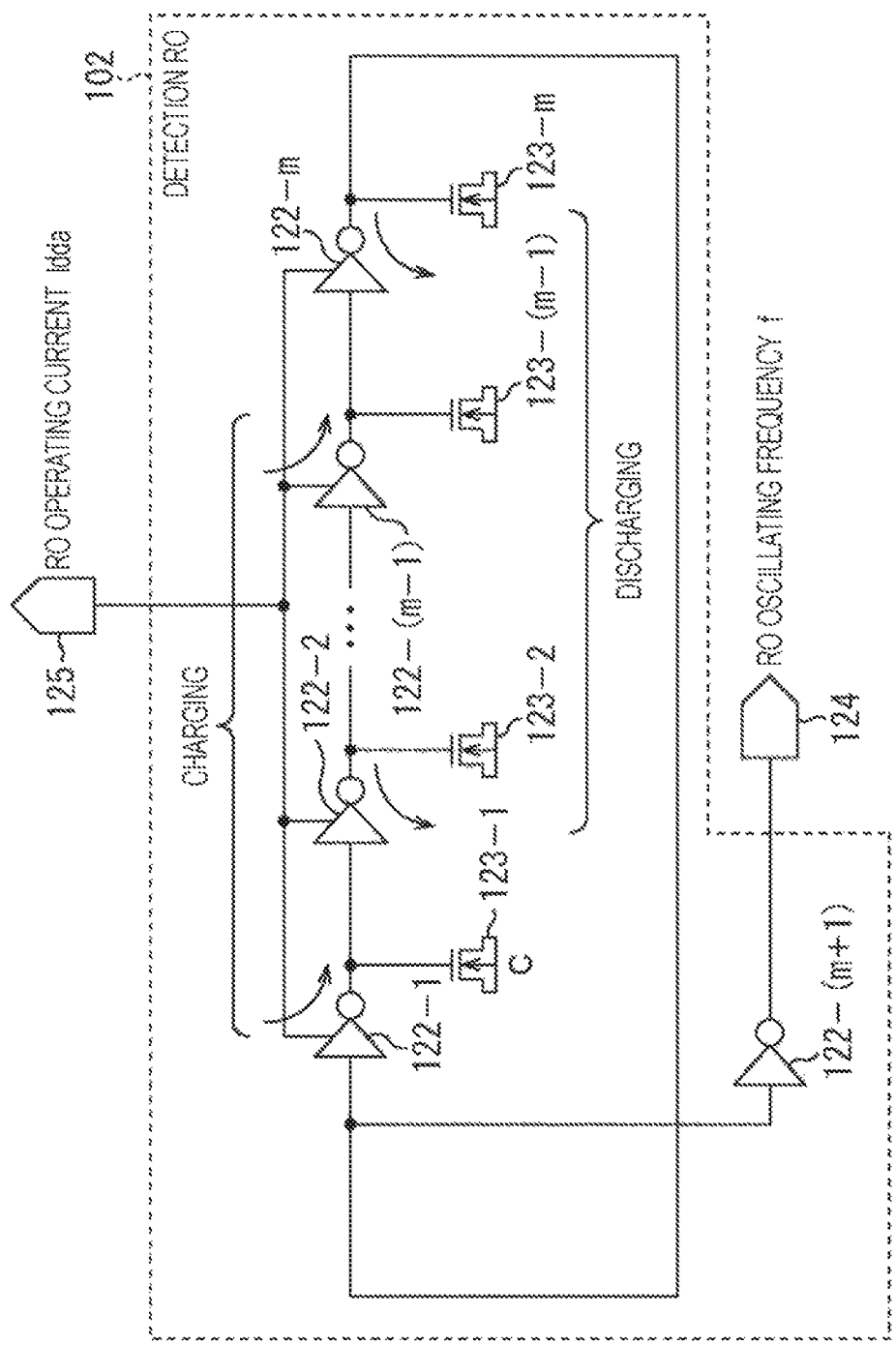
FIG. 6 is a diagram for describing a method of calculating a gate width and an effective gate width using a ring oscillator.

Next, a method of calculating the gate length using the detection RO 102 will be described with reference to FIG. 6. Incidentally, in the description, the transistor (MISFIT) 123 is assumed to have a configuration illustrated in FIG. 7.

Figure 7:
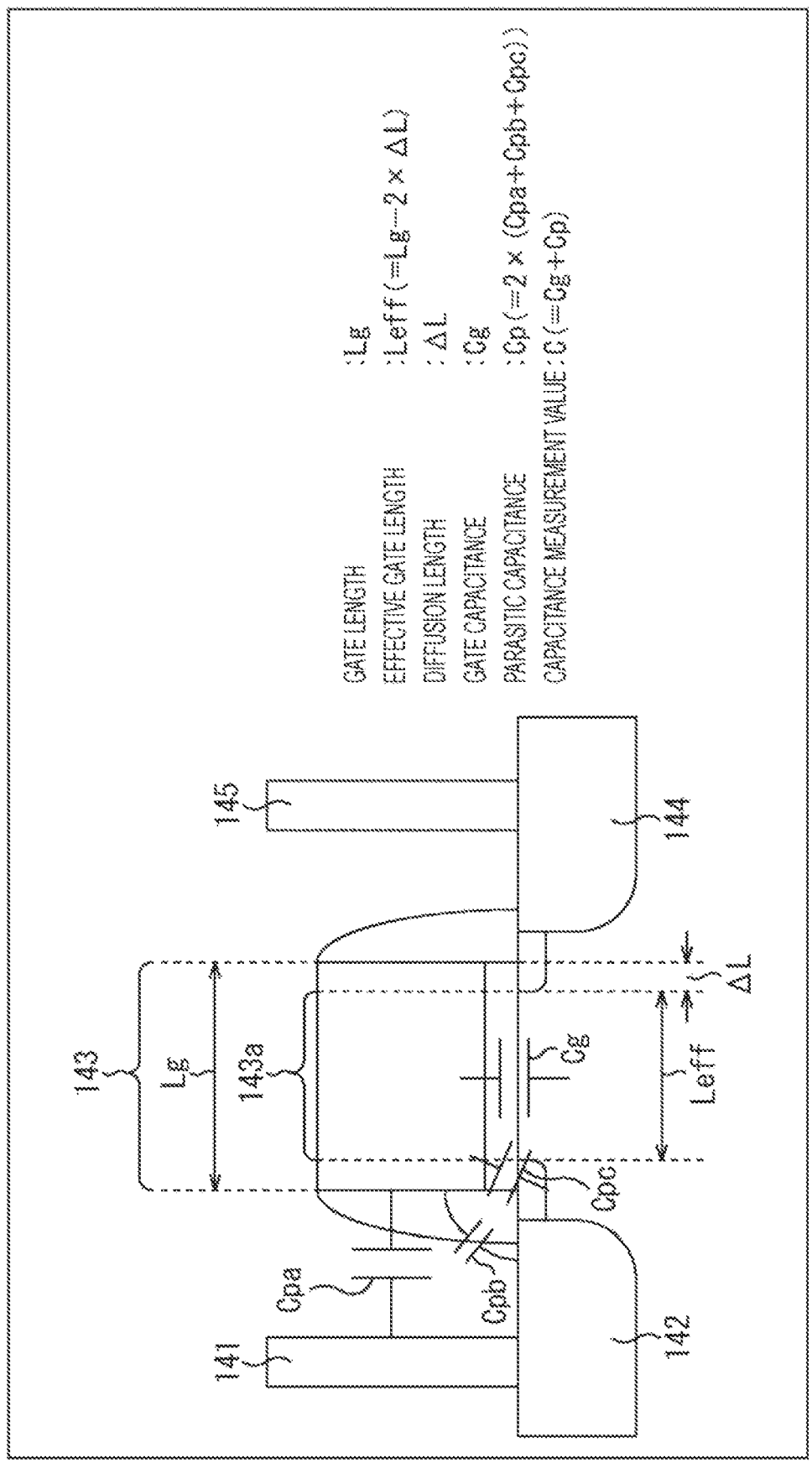
FIG. 7 is a diagram for describing a relation between a configuration around a transistor and a parameter.

The transistor 123 includes a source terminal (or drain terminal) 141, a source layer (or drain layer) 142, a gate 143, a drain layer (or source layer) 144, and a drain terminal 145 as illustrated in FIG. 7.

Further, in the following description, as illustrated in FIG. 7, Lg indicates a gate length of the gate 143, Leff ($=Lg-2 \times \Delta L$) indicates an effective gate length of an effective gate 143a, $\Delta L$ indicates a diffusion length of a diffusion layer 143b, Cg indicates gate capacitance, Cp ($=2 \times (Cpa+Cpb+Cpc)$) indicates parasitic capacitance, Cpa, Cpb, and Cpc indicate parasitic capacitance between the gate 143 and the source terminal 141, parasitic capacitance between the gate 143 and the source layer 142, and parasitic capacitance of the diffusion layer 143b, respectively, and C ($=Cg+Cp$) indicate a capacitance measurement value.

In general, the load capacitance C of an N-th stage ring oscillator can be calculated by the following Formula (1) using a ring oscillator oscillating frequency f, a ring oscillator oscillating current Idda, a ring oscillator standby current Iddq, and a power voltage VDD.

$$(Idda-Iddq)=N \times C \times VDD \times f \quad (1)$$

In a case in which the gate capacitance C is a load, since it has a nonlinear voltage dependency, it is desirable to calculate differential capacitance for a plurality of gate voltages Vg, and it can be calculated by the following Formula (2).

$$\Delta(Idda-Iddq)=N \times C \times \Delta Vg \times f \quad (2)$$

Therefore, each gate capacitance can be calculated by Formula (2) by calculating the frequency, the oscillating current, and the standby current of the ring oscillator having at least two or more gate capacitances which differ in the gate length Lg as the load capacitance.

Figure 8:
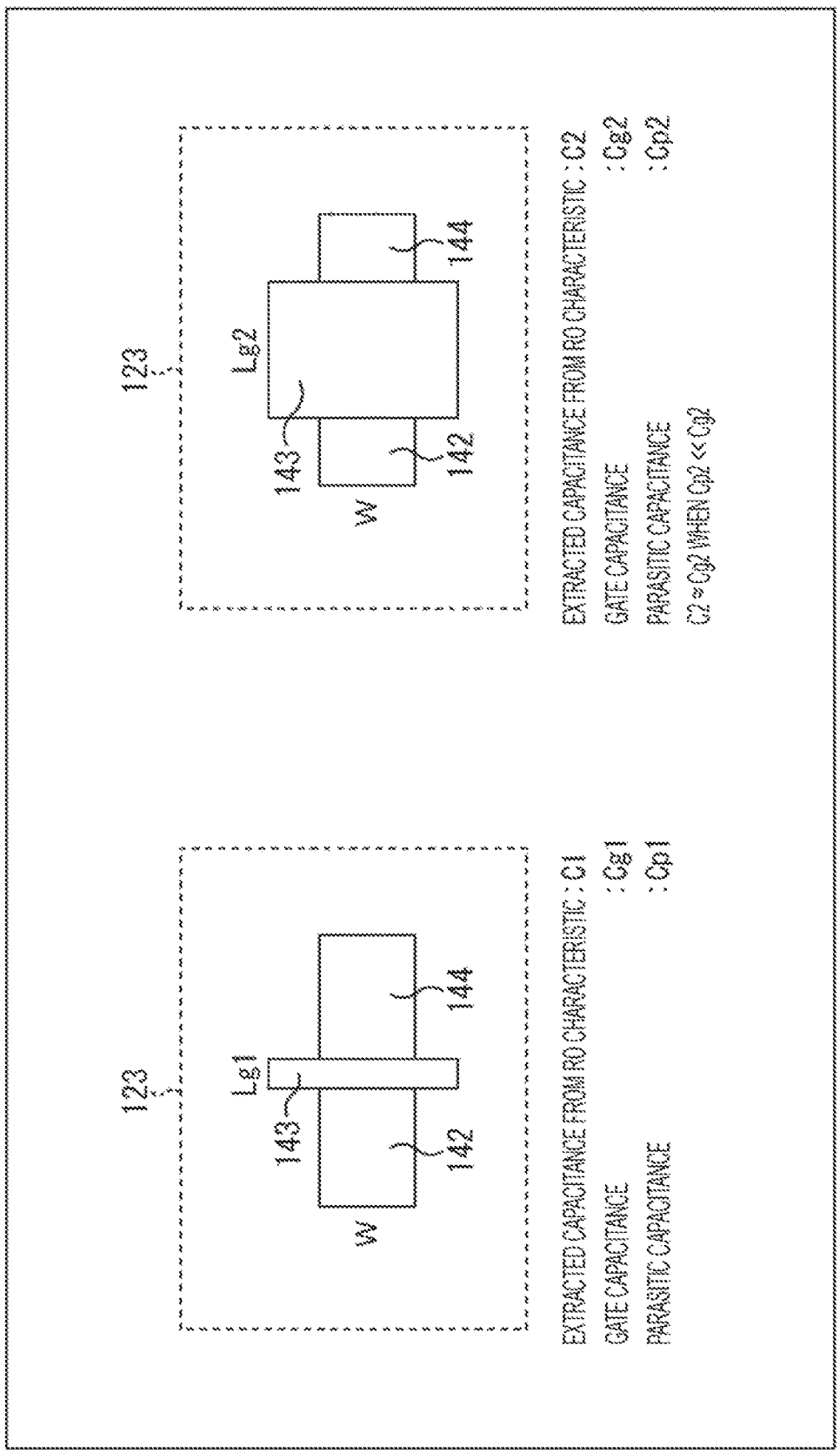
FIG. 8 is a diagram for describing a calculation example of a gate width and an effective gate width.

For example, each of a transistor 123 of gate capacitance Cg1 with a gate of a gate length Lg1 desired to be calculated which is illustrated at a left part of FIG. 8 and a transistor 123 of load capacitance C2 with a gate of a sufficiently large gate length Lg2 in which a variation can be ignored which is illustrated in a right part of FIG. 8 is connected to the ring oscillator.

Gate widths W are assumed to be the same, and the load capacitances C1 and C2 are calculated by Formula (2). Here, the capacitance calculated by Formula (2) includes various parasitic capacitances Cp illustrated in FIG. 7 in addition to the gate capacitance Cg.

For the gate capacitances Cg1 and Cg2 of the gate lengths Lg1 and Lg2, parasitic capacitance other than the gate capacitance Cg is separately extracted as parasitic capacitances Cp1 and Cp2. Here, since the gate length Lg2 is set to be sufficiently large so that it is not affected by a variation, the parasitic capacitance Cp2<<Cg2 can be regarded, and thus the gate capacitance Cg2≈C2 is regarded.

Therefore, the following Formula (3) is obtained if the gate length Lg2 is considered to be known.

$$Cg1/Cg2=(C1-Cp1)/C2=Lg1/Lg2 \quad (3)$$

The gate length Lg1 can be calculated by Formula (3).

<Calculation Method of Effective Gate Length>

A method of calculating the effective gate length Leff will be explained.

The gate capacitance Cg (=C−Cp) is calculated by subtracting the parasitic capacitance Cp separately extracted by a certain method from the capacitance value C extracted by Formula (2).

Figure 9:
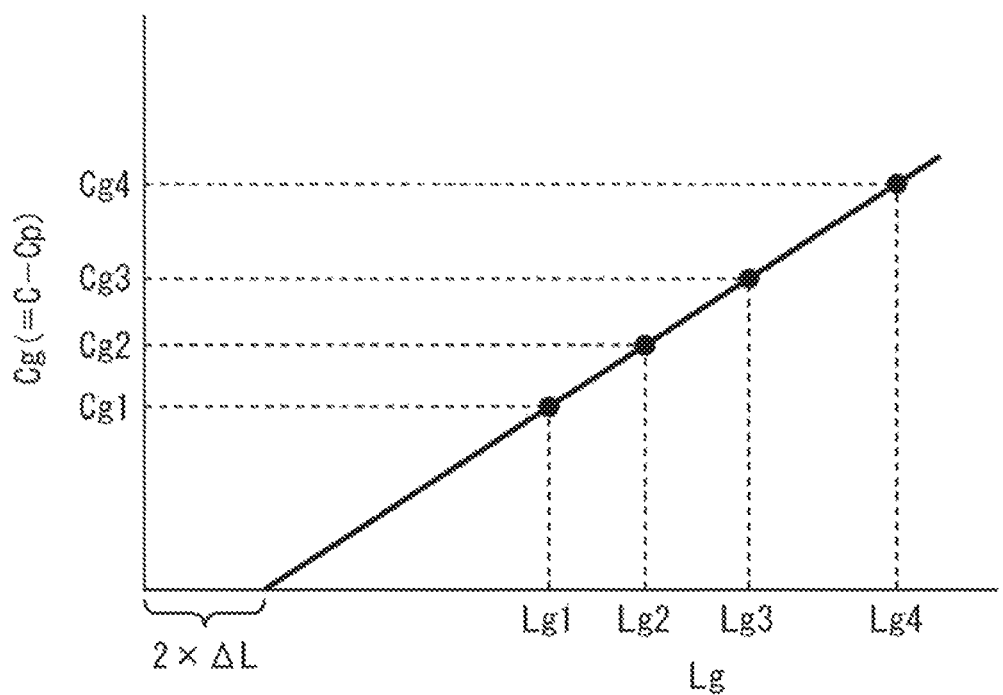
FIG. 9 is a diagram for describing a relation between a design gate width and gate capacitance.

When a design value Lg (Design) of the gate length is plotted on a horizontal axis, and Cg corresponding to a different gate length is plotted on a vertical axis, the design value Lg (Design) of the gate length and the gate capacitance Cg constitute a linear function having a point intersecting with the horizontal axis without passing through an origin illustrated in FIG. 9.

The point intersecting with the horizontal axis corresponds to a diffusion length 2×ΔL illustrated in FIG. 7. Therefore, an effective gate length Leff1 desired to be obtained is indicated by the following Formula (4).

$$Leff1=Lg1(Design)-2 \times \Delta L \quad (4)$$

<Calculation Method of Parasitic Capacitance>

Here, an example of extracting a gate insulating film capacitance by subtracting a parasitic capacitance from a capacitance value extracted by Formula (2) in order to calculate the gate length and the effective gate length with higher degree of accuracy will be described here.

Figure 10:
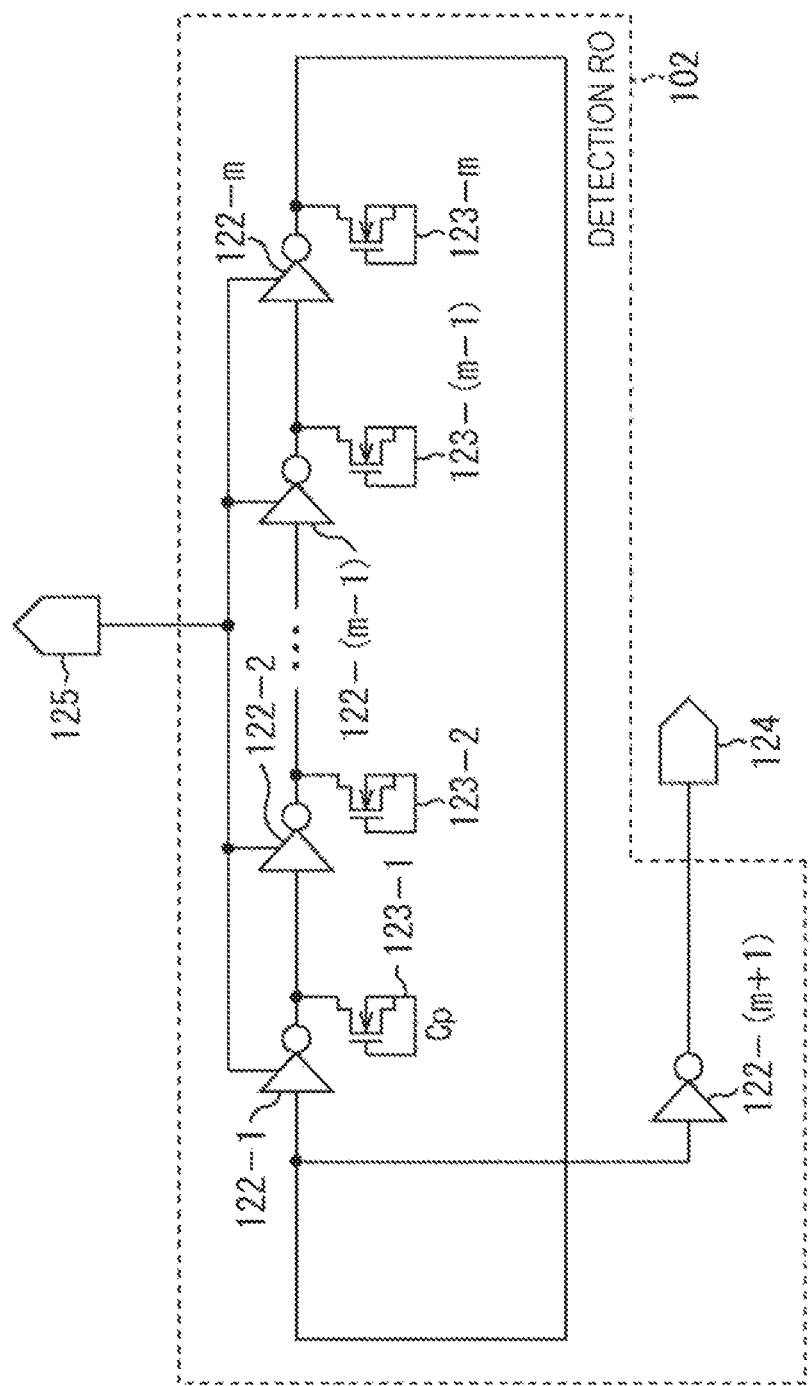
FIG. 10 is a diagram for describing a method of calculating parasitic capacitance.

For example, as illustrated in FIG. 10, an output of each ring oscillator stage is not connected to the gate but connected to the diffusion layer of each transistor 123 as the load capacitance, and in this structure, the parasitic capacitance Cp is extracted by Formula (2).

Incidentally, the example of directly calculating the load capacitance C by measuring the oscillating current Idda and the standby current Iddq of the ring oscillator of FIG. 5 in addition to the oscillating frequency f has been described above.

However, although the load capacitance C is not calculated directly, the load capacitance C and the oscillating frequency f of the ring oscillator have an inverse proportional relation, and if the gate length is thicker, and the gate load capacitance is increased, the oscillating frequency of the ring oscillator becomes slower (conversely, if the gate length is thinner, and the gate load capacitance is decreased, the oscillating frequency of the ring oscillator becomes faster), and thus the gate length variations can be relatively compared even by calculating the ratio of the oscillation frequencies of the ring oscillators having different gate lengths. Of course, in order to detect the gate length variation with higher degree of accuracy, it is desirable to calculate the gate length or the effective gate length in accordance with the above embodiment.

<Product Test Process>

Figure 11:
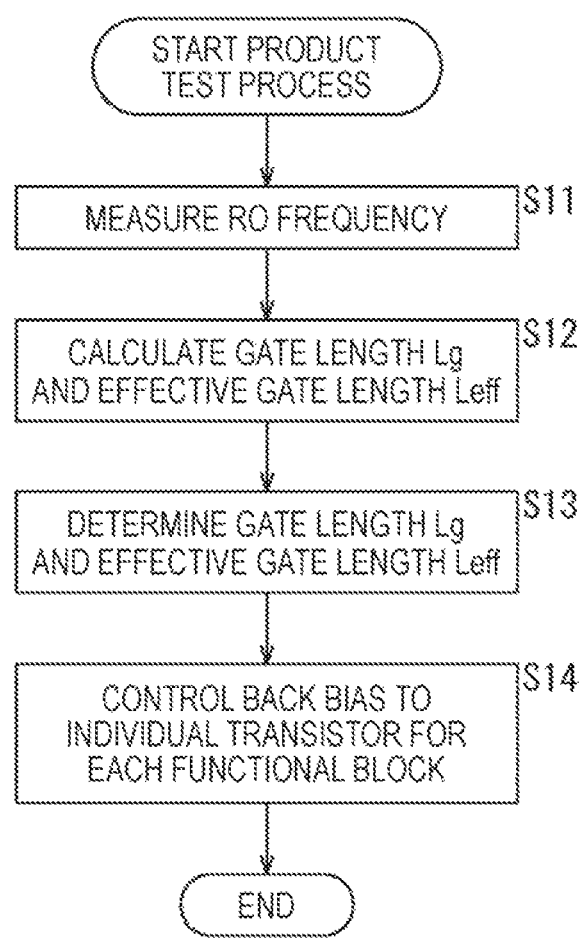
FIG. 11 is a flowchart for describing a product test process.

Next, a product test process by the calculating unit 111 of FIG. 4 will be described with reference to a flowchart of FIG. 11. Incidentally, since the calculating unit 111 is configured to be connected to the semiconductor device 100 when the product test process is performed, the calculating unit 111 is assumed to be connected at the time of the product test process.

In step S11, the calculating unit 111 supplies a ring oscillator enable signal to each of the terminals 120 of the detection ROs 102-1 to 102-4, and measures the oscillating frequency f of an oscillated signal through the terminal 124. Further, the calculating unit 111 measures the oscillating current Idda and the standby current Iddq.

In step S12, the calculating unit 111 calculates the gate length Lg and the effective gate length Leff on the basis of the oscillating frequency f, the oscillating current Idda, and the standby current Iddq using the above-described technique.

In step S13, the calculating unit 111 determines a product on the basis of the calculated gate length Lg and the effective gate length Leff for each detection RO 102, and gives a notification to the back bias control unit 101 in accordance with a determination result.

More specifically, the calculating unit 111 determines whether it is a first state in which there is no problem in the gate length Lg and the effective gate length Leff, a second state in which there is a problem in the gate length Lg and the effective gate length Leff, but it is able to be corrected by applying a back bias by the back bias control unit 101, or a third state in which there is a problem in the gate length Lg and the effective gate length Leff, but it is unable to be corrected although a back bias is applied by the back bias control unit 101 on the basis of the calculated gate length Lg and the effective gate length Leff for each detection RO 102.

Then, in a case in which it is the first state, the calculating unit 111 gives a notification indicating that it is not necessary to apply the back bias since there is no abnormality in the product to the back bias control unit 101, and in a case in which it is the second state, the calculating unit 111 gives a notification indicating the correction value based on the calculated gate length Lg and the effective gate length Leff and gives a notification of an instruction to apply the back bias, and in a case in which it is the third state, the calculating unit 111 gives a notification indicating that the product is defective.

In step S14, the back bias control unit 101 performs control corresponding to content of the notification for each functional block 103 corresponding to each detection RO 102 in response to the notification from the calculating unit 111.

In other words, in the case of the above-described first state, the back bias control unit 101 does not apply the back bias to the corresponding functional block 103 in a case in which it is the first state, applies the back bias corresponding to the correction value to the corresponding functional block in a case in which it is the second state, and leaves a mark indicating that the product is defective in a case in which it is the third state.

With the above process, it is possible to the measure the gate length Lg and the effective gate length Leff rapidly with high degree of accuracy. As a result, the product test can be realized in accordance with the measurement result, and the correction can be realized by the back bias in accordance with the necessity, so that the product yield can be improved.

<Manufacturing Method of the Semiconductor Device of FIG. 4>

Next, a manufacturing method of the semiconductor device 100 of FIG. 4 will be described with reference to FIG. 12.

In the manufacturing method of the semiconductor device 100, for example, the inverters 122 and at least two or more gate load capacitors having different gate lengths in each stage constituting the detection RO 102 are formed at the same time. Thereafter, wiring for connecting the diffusion layer of the output portion of the inverter 122 and the gate 143 of the transistor 123 is formed in a wiring process after a next process.

Figure 12:
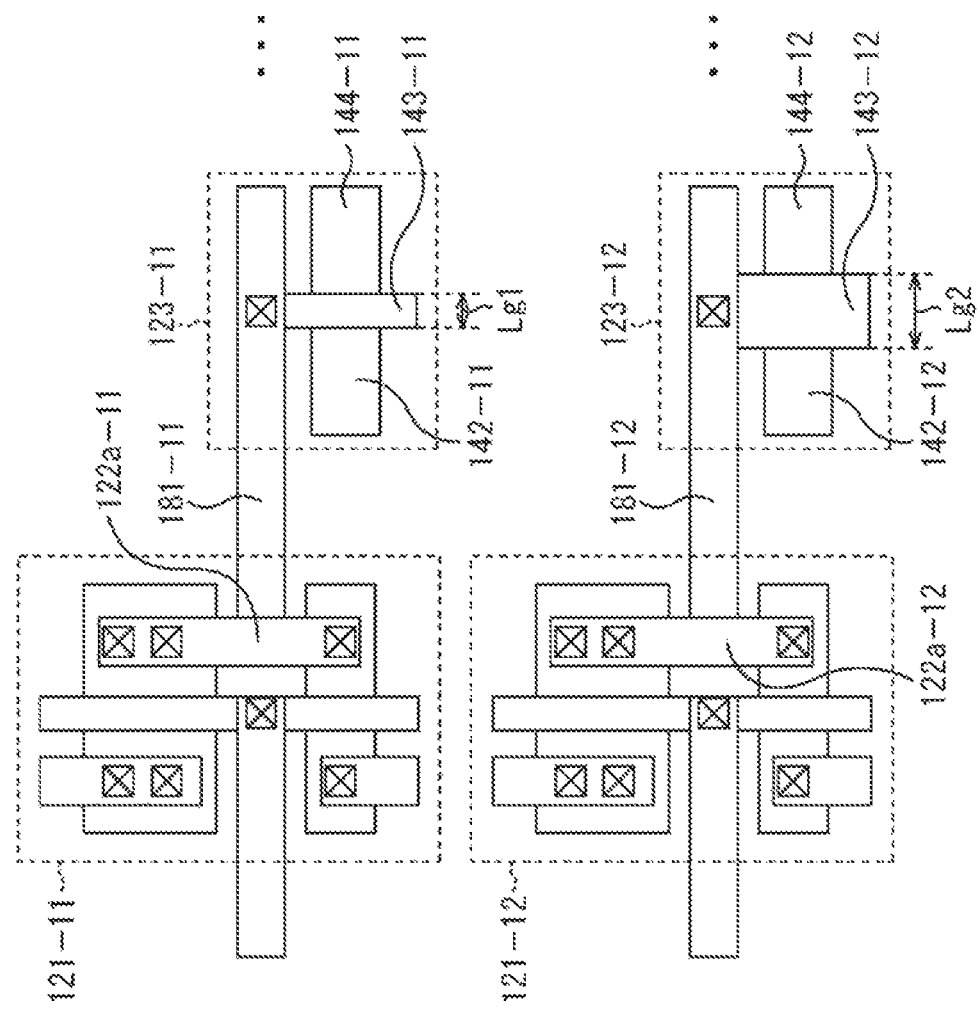
FIG. 12 is a diagram for describing a manufacturing method of a detection RO of FIG. 5.

More specifically, in a first process, inverters 122-11 and 122-12 and transistors 123-11 and 123-12 illustrated in FIG. 12 are formed at the same time. Here, gate lengths of gates 143-11 and 143-12 in the transistors 123-11 and 123-12 are, for example, gate lengths Lg11 and Lg12, respectively, and are different from each other (Lg11≠Lg12).

In a second process, wiring 181-11 and 181-12 connecting diffusion layers 122a-11 and 122a-12 of the inverter 122-11 and 122-12 and gates 143-11 and 143-12 of the transistors 123-11 and 123-11 illustrated in FIG. 12 are formed.

Incidentally, in FIG. 12, an example of connecting one inverter 122 with one transistor 123 for the same gate length is illustrated, but the same applies even in the case of a plurality of stages. Further, the NAND circuit 121 and the inverter 122-(m+1) are also formed in the first process.

With such a manufacturing process, the detection RO 102 is formed. As a result, it is possible to form a ring oscillator for each transistor of the same gate length Lg. As a result, it is possible to measure the gate length Lg and the effective gate length Leff easily and rapidly, and it is possible to realize the product test in accordance with the measurement result and perform the correction by the back bias in a case in which the necessity, so that the product yield can be improved.

<First Modified Example>

In the above example, the terminals 120-1 to 120-n of the enable signals Enable_1 to Enable_n and the terminals 124-1 to 124-n of the output signal f_1 to f_n are installed in the detection ROs 102-1 to 102-n, and control is performed in accordance with the enable signals Enable_1 to Enable_n such that the output signals f_1 to f_n are output.

However, a selector may be installed to integrating the number of input terminals and the number of output terminals.

Figure 13:
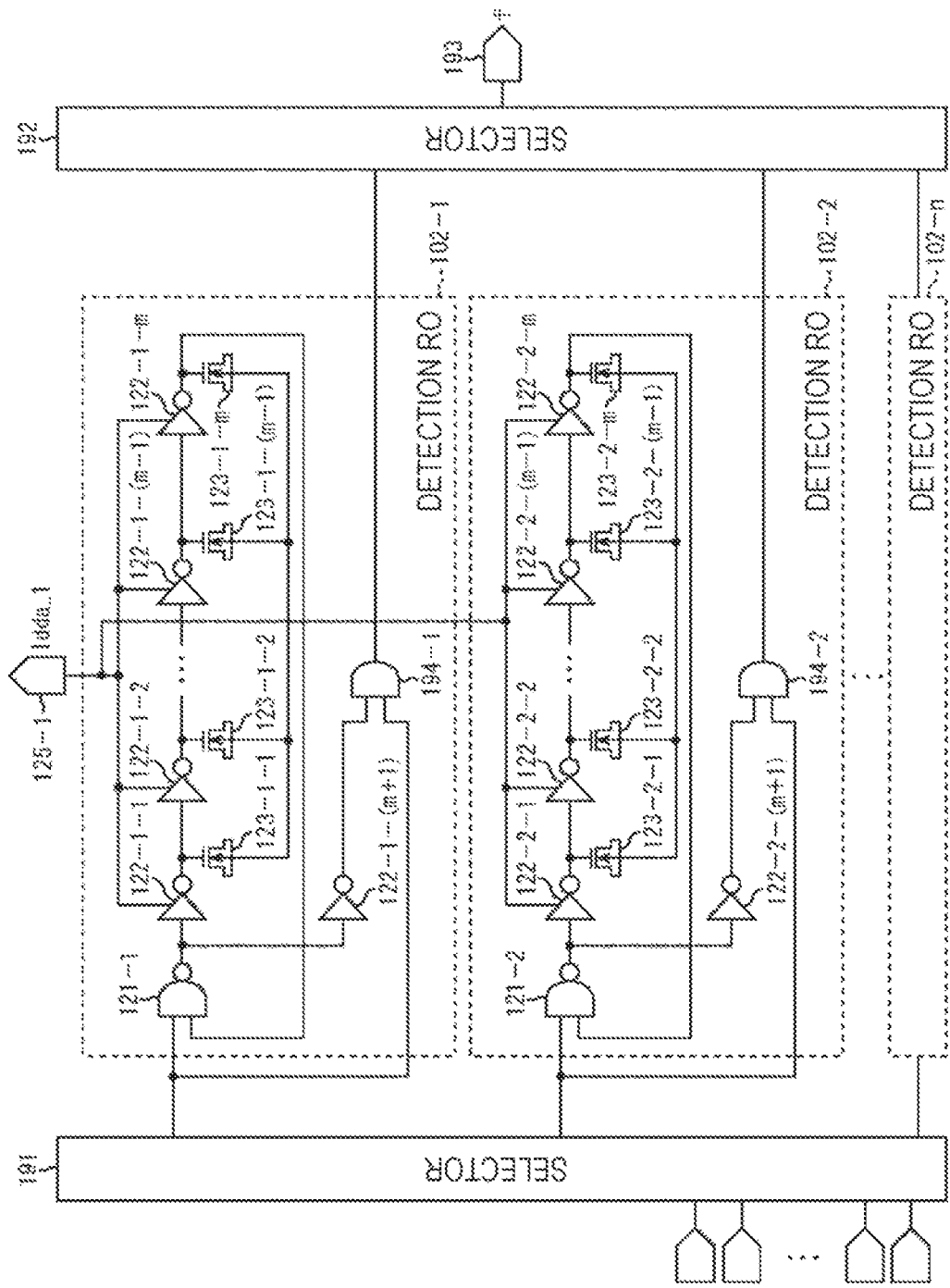
FIG. 13 is a diagram for describing a first modified example of a detection RO.

FIG. 13 illustrates a configuration example of detection ROs 102-1 to 102-n in which a selector is installed. Incidentally, in a configuration of FIG. 13, the same reference numerals are assigned to components having the same functions as those of the components of FIG. 5, and description thereof will be omitted as appropriate.

In other words, a difference between the detection ROs 102-1 to 102-n of FIG. 13 and the detection ROs 102-1 to 102-n of FIG. 5 lies in that, instead of the terminal 120-1 to 120-n and the terminal 124-1 to 124-n, selectors 191 and 192 obtained by integrating them are installed.

The selector 191 receives an input of a selection signal corresponding to any one of the enable signals Enable_1 to Enable_n and outputs a signal to the corresponding detection RO 102.

The selector 192 selectively outputs an output signal corresponding to one of the output signals f_1 to f_n from the terminal 193. Further, AND circuit 194-1 to 194-n are installed, the output terminals of the inverters 122-1-(m+1) to 122-n-(m+1) and the wiring from the selector 191 are connected to an input terminal d, and an output terminal is connected to the selector 192.

As the selectors 191 and 192 are installed as described above, it is possible to reduce the number of terminals by integrating the number of input terminals and the number of output terminals into one.

<Second Modified Example>

The example of installing the selectors instead of the terminals 120-1 to 120-n of the enable signals Enable_1 to Enable_n and the terminals 124-1 to 124-n of the output signals f_1 to f_n has been described above, but the detection ROs 102 may be integrated into one such that the gates of the transistors 123-1 to 123-n of a plurality of different gate lengths are connected in parallel between the inverters 122, a switch is installed therein, and the transistors 123 having different gate lengths are switched and used as the ring oscillator.

Figure 14:
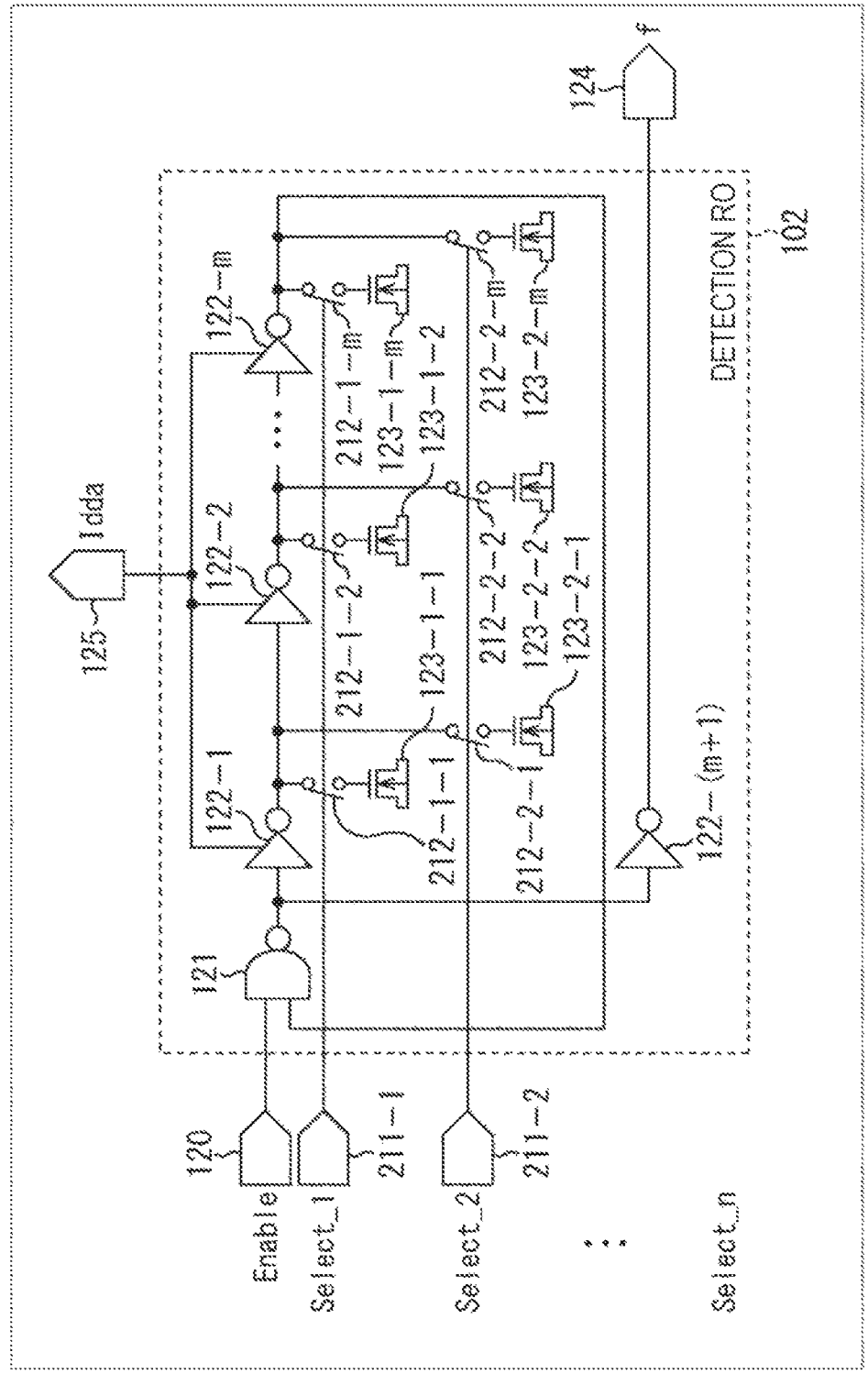
FIG. 14 is a diagram for describing a second modified example of a detection RO.

FIG. 14 illustrates a configuration example when the detection ROs 102 are integrated into one such that the gates of the transistors 123-1 to 123-n of respective different gate lengths are connected between the inverters 122 in parallel, and a switch is installed therein.

More specifically, the gates of the transistor 123-1-1 to 123-n-1 are connected to wiring connecting the output terminal of the inverter 122-1 with the input terminal of the inverter 122-2, and switches 212-1-1 to 212-n-1 are connected thereto. Further, in subsequent stages of the other inverters 122, the gates of the transistors 123 having different gate lengths are similarly connected.

Further, a terminal 211-1 of a selection signal Select_1 for controlling the switches 212-1-1 to 212-1-m connected to the gates of the transistors 123-1-1 to 123-1-m of the gate length Lg1 is installed, a terminal 211-2 of a selection signal Select_2 for controlling the switches 212-2-1 to 212-2-m connected to the gates of the transistors 123-2-1 to 123-2-m of the gate length Lg2 is installed, and the inverter 122, the transistor 123, and the switch 212 in subsequent stages are similarly installed.

With such a configuration, any one of the switches 212-1-1 to 212-1-m, 212-2-1 to 212-2-m, . . . , and 212-n-1 to 212-n-m is selectively controlled in accordance with any one of the selection signals Select_1 to Select_n such that the detection RO 102 formed by only the transistor 123 of the selected gate length is formed.

Accordingly, it is possible to switch and use the detection RO 102 including a plurality of transistors with different gate lengths with one ring oscillator. As a result, it is possible to reduce an area for constructing the ring oscillator.

<Manufacturing Method of Semiconductor Device of FIG. 14>

Next, a manufacturing method of the semiconductor device 100 of FIG. 14 will be described with reference to FIG. 15.

In the manufacturing method of the semiconductor device 100, for example, the inverters 122, at least two or more gate load capacitors having different gate lengths, and the switch 212 in each stage constituting the detection RO 102 are formed at the same time. Thereafter, the diffusion layer of the output portion of the inverter 122, and the gate 143 of the transistor 123, and the switch 212 are connected in a wiring process after a next process.

Figure 15:
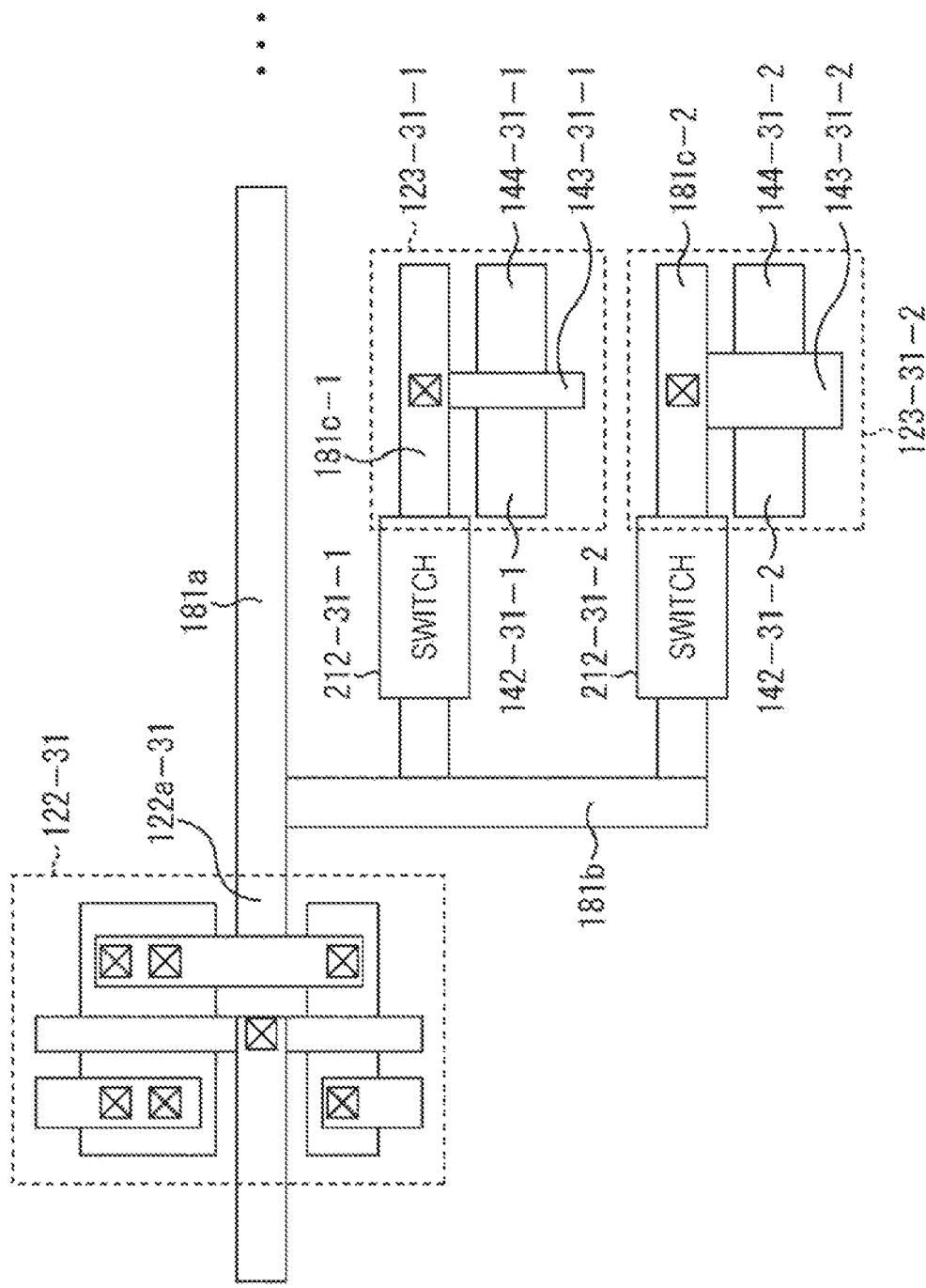
FIG. 15 is a diagram for describing a manufacturing method of the detection RO of FIG. 14.

More specifically, an inverter 122-31 and transistors 123-31-1 and 123-31-2 illustrated in FIG. 15 are formed at the same time in a first process.

In a second process, wiring 181a and 181b and wiring 181c-1 and 181c-2 connecting a diffusion layers 122a-31 of the inverter 122-31, switches 212-31-1 and 212-31-2, gates 143-31-1, 143-31-2 of transistors 123-31-1 and 123-31-2 illustrated in FIG. 15 are formed.

With such a manufacturing process, one detection RO 102 can be switched and used as a ring oscillator including the transistors 123 of a plurality of gate lengths.

As a result, it is possible to measure the gate length Lg and the effective gate length Leff rapidly with high degree of accuracy, and it is possible to realize the product test in accordance with the measurement result and perform the correction by the back bias in a case in which the necessity, so that the product yield can be improved.

<Third Modified Example>

The example in which the detection ROs 102 are integrated into one such that the gates of the transistors 123-1 to 123-n having respective different gate lengths are connected in parallel between the inverters 122, and the switch is installed therein has been described above, but a selector may be further installed instead of the respective terminals 211-1 to 211-n of the selection signals Select_1 to Select_n and the terminal 124 of the output signal f.

FIG. 16 illustrates a configuration example of a detection RO 102 of a semiconductor device 100 in which, although the example in which the detection ROs 102 are integrated into one such that the gates of the transistors 123-1 to 123-n having respective different gate lengths are connected in parallel between the inverters 122, and the switch is installed therein has been described above, a selector is further installed instead of the respective terminals 211-1 to 211-n of the selection signals Select_1 to Select_n and the terminal 124 of the output signal f.

Incidentally, in a configuration of the semiconductor device of FIG. 16, the same reference numerals are assigned to components having the same functions as those of the components of FIG. 14, and description thereof will be omitted as appropriate.

In other words, in FIG. 16, a difference from the configuration of the detection RO 102 of the semiconductor device 100 of FIG. 14 lies in that selectors 231 and 232 are installed instead of the respective terminals 211-1 to 211-n of the selection signals Select_1 to Select_n and the terminal 124 of the output signal f.

The selectors 231 and 232 are basically similar to the selectors 191 and 192, and the selector 231 supplies a signal indicating a ring oscillator of a selected gate length to the selector 232, and the selector 232 adds a signal indicating a gate length of the ring oscillator to an output signal and outputs the resulting output signal through the terminal 233.

With the above configuration, it is possible to integrate the ring oscillators into one, and further, it is possible to reduce the number of terminals of the selection signal on both the input side and the output side, so that it is necessary to reduce an area necessary for forming the semiconductor device 100.

As described above, according to the semiconductor device of the present disclosure, since the gate length variation sensitivity within the wafer surface or one shot of the lithography is high, it is possible to give detailed feedback for gate transfer lithography or the gate processing process, and it is possible to construct the process in which the gate length variation is suppressed.

Further, since it can be measured at the same time as the product test, it is easy to check a correlation with the gate length variation which is a defect factor of the product test, so that analytical performance is improved, and it is possible to give feedback for construction of the gate processing process in which the defect rate in the product test is suppressed.

In addition, when it is combined with a circuit correction technique, it is possible to minimize the influence of the gate length variation on the circuit characteristic and to increase the yield in the product test.

Incidentally, the present disclosure can also have the following configurations.

<1> A semiconductor device, including:
a plurality of transistors;
a plurality of inverters;
a ring oscillator configured such that the plurality of inverters is connected in a ring-like form, and gate capacitors of the transistors are connected to respective output terminals of the plurality of inverters as a load capacitor; and
a terminal that outputs an oscillating signal of the ring oscillator,
in which the ring oscillator is configured with a plurality of transistors having the same gate length, and at least two or more ring oscillators including a plurality of transistors having different gate lengths are configured.

<2> The semiconductor device according to <1>, in which the at least two or more ring oscillators are configured such that gate capacitors of the transistors of the same gate length are connected to the respective output terminals of the plurality of the inverters as the load capacitor.

<3> The semiconductor device according to <2>, further including a selector that selects the least two or more ring oscillators.

<4> The semiconductor device according to any of <1> to <3>,
in which, in the at least two or more ring oscillators, gate capacitors of the transistors having at least two or more types of different gate lengths are connected to the respective output terminals of the plurality of the inverters in parallel as the load capacitor,
a plurality of switches that connects each of the inverters and each of the gate capacitors in series and performs on/off switching is installed, and
switching to at least two or more ring oscillators is performed by performing the on/off switching of the switch to which the gate capacitors of the same type of gate lengths are connected.

<5> The semiconductor device according to <4>, further including a selector that selects the switch to which the gate capacitors of the same type of gate lengths are connected among the plurality of switches.

<6> The semiconductor device according to any of <1> to <5>, further includes a terminal for measuring an operating current of the ring oscillator.

<7> The semiconductor device according to any of <1> to <6>, in which the semiconductor device is connected with a calculating unit that calculates the gate length on the basis of a frequency of the oscillating signal.

<8> The semiconductor device according to any of <1> to <7>, in which the calculating unit compares the calculated gate length with a design value, and outputs a correction value on the basis of a comparison result, and the semiconductor device further includes a back bias control unit that applies a back bias for correcting an operation of the transistor on the basis of the correction value output from the calculating unit.

<9> An operation method of a semiconductor device including:

a plurality of transistors;

a plurality of inverters;

a ring oscillator configured such that the plurality of inverters is connected in a ring-like form, and gate capacitors of the transistors are connected to respective output terminals of the plurality of inverters as a load capacitor; and a terminal that outputs an oscillating signal of the ring oscillator, in which the ring oscillator is configured with a plurality of transistors having the same gate length, and at least two or more ring oscillators including a plurality of transistors having different gate lengths are configured, and the operation method includes:

outputting, by the ring oscillator, an oscillating signal from the terminal.

<10> A manufacturing method of a semiconductor device including:

a plurality of transistors;

a plurality of inverters;

a ring oscillator configured such that the plurality of inverters is connected in a ring-like form, and gate capacitors of the transistors are connected to respective output terminals of the plurality of inverters as a load capacitor; and a terminal that outputs an oscillating signal of the ring oscillator, in which the ring oscillator is configured with a plurality of transistors having the same gate length, and at least two or more ring oscillators including a plurality of transistors having different gate lengths are configured, and the manufacturing method includes:

forming a plurality of transistors and the plurality of inverters in a first process; and forming wiring connecting the plurality of transistors with the plurality of inverters in a second process.

<11> The manufacturing method of the semiconductor device according to <10>, in which, in the second process, the wiring connecting the gate capacitors of the transistors of the same gate length with the respective output terminals of the plurality of inverters as the load capacitor is formed.

<12> The manufacturing method of the semiconductor device according to <10>, in which, in the first process, a plurality of switches that connects each of the inverters and each of the gate capacitors in series and performs on/off switching is further formed, and in the second process, the wiring connecting the gate capacitors of the transistors of at least two or more types of different gate lengths with the respective output terminals of the plurality of inverters in parallel as the load capacitor is formed.

REFERENCE SIGNS LIST

100 Semiconductor device
101 Back bias control unit
102, 102-1 to 102-n Detection ring oscillator (RO)
103, 103-1 to 103-4 Functional block
111 Calculating unit
120, 120-1 to 120-n Terminal
121, 121-1 to 121-n NAND circuit
122, 122-1-1 to 122-n-(m+1) Inverter
123, 123-1-1 to 123-n-(m+1) Transistor
124, 124-1 to 124-n Terminal
125, 125-1 to 125-n Current measuring unit
141 Source (drain) terminal
142 Source (drain) region
143 Gate
143a Diffusion region
144 Drain (source) region
145 Drain (source) terminal
181, 181a to 181c Wiring
191, 192 Selector
193 Terminal
194, 194-1 to 194-n AND circuit
211, 211-1 to 211-n Terminal
212, 212-1-1 to 212-n-(m+1) Switch
231, 232 Selector
233 Terminal

The invention claimed is:

1. A semiconductor device, comprising:
a plurality of transistors;
a plurality of inverters;
a ring oscillator configured such that the plurality of inverters is connected in a ring-like form, and gate capacitors of the transistors are connected to respective output terminals of the plurality of inverters as a load capacitor; and
a terminal that outputs an oscillating signal of the ring oscillator,
wherein the ring oscillator is configured with a plurality of transistors having a same gate length, and at least two or more ring oscillators including a plurality of transistors having different gate lengths are configured.

2. The semiconductor device according to claim 1, wherein the at least two or more ring oscillators are configured such that gate capacitors of the transistors of the same gate length are connected to the respective output terminals of the plurality of the inverters as the load capacitor.

3. The semiconductor device according to claim 2, further comprising a selector that selects the least two or more ring oscillators.

4. The semiconductor device according to claim 1,
wherein, in the at least two or more ring oscillators, gate capacitors of the transistors having at least two or more types of different gate lengths are connected to the respective output terminals of the plurality of the inverters in parallel as the load capacitor,
a plurality of switches that connects each of the inverters and each of the gate capacitors in series and performs on/off switching is installed, and
switching to at least two or more ring oscillators is performed by performing the on/off switching of the switch to which the gate capacitors of a same type of gate lengths are connected.

5. The semiconductor device according to claim 4, further comprising a selector that selects the switch to which the gate capacitors of the same type of gate lengths are connected among the plurality of switches.

6. The semiconductor device according to claim 1, further comprising a terminal that measures an operating current of the ring oscillator.

7. The semiconductor device according to claim 1, wherein the semiconductor device is connected with a calculating unit that calculates the gate length on a basis of a frequency of the oscillating signal.

8. The semiconductor device according to claim 1,
wherein the calculating unit compares the calculated gate length with a design value, and outputs a correction value on a basis of a comparison result, and
the semiconductor device further comprises a back bias control unit that applies a back bias for correcting an operation of the transistor on a basis of the correction value output from the calculating unit.

9. An operation method of a semiconductor device including:
a plurality of transistors;
a plurality of inverters;
a ring oscillator configured such that the plurality of inverters is connected in a ring-like form, and gate capacitors of the transistors are connected to respective output terminals of the plurality of inverters as a load capacitor; and
a terminal that outputs an oscillating signal of the ring oscillator,
wherein the ring oscillator is configured with a plurality of transistors having a same gate length, and at least two or more ring oscillators including a plurality of transistors having different gate lengths are configured, and
the operation method comprises:
outputting, by the ring oscillator, an oscillating signal from the terminal.

10. A manufacturing method of a semiconductor device including:
a plurality of transistors;
a plurality of inverters;
a ring oscillator configured such that the plurality of inverters is connected in a ring-like form, and gate capacitors of the transistors are connected to respective output terminals of the plurality of inverters as a load capacitor; and
a terminal that outputs an oscillating signal of the ring oscillator,
wherein the ring oscillator is configured with a plurality of transistors having a same gate length, and at least two or more ring oscillators including a plurality of transistors having different gate lengths are configured, and
the manufacturing method comprises:
forming a plurality of transistors and the plurality of inverters in a first process; and
forming wiring connecting the plurality of transistors with the plurality of inverters in a second process.

11. The manufacturing method of the semiconductor device according to claim 10, wherein, in the second process, the wiring connecting the gate capacitors of the transistors of the same gate length with the respective output terminals of the plurality of inverters as the load capacitor is formed.

12. The manufacturing method of the semiconductor device according to claim 10,
wherein, in the first process, a plurality of switches that connects each of the inverters and each of the gate capacitors in series and performs on/off switching is further formed, and
in the second process, the wiring connecting the gate capacitors of the transistors of at least two or more types of different gate lengths with the respective output terminals of the plurality of inverters in parallel as the load capacitor is formed.

* * * * *